(12) United States Patent
Chiba et al.

(10) Patent No.: US 6,728,332 B2
(45) Date of Patent: Apr. 27, 2004

(54) X-RAY MASK, AND EXPOSURE METHOD AND APPARATUS USING THE SAME

(75) Inventors: Keiko Chiba, Utsunomiya (JP); Masami Tsukamoto, Yokohama (JP); Yutaka Watanabe, Shioya-gun (JP); Shinichi Hara, Kita Saitama-gun (JP); Hiroshi Maehara, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 82 days.

(21) Appl. No.: 09/970,826

(22) Filed: Oct. 5, 2001

(65) Prior Publication Data

US 2002/0021781 A1 Feb. 21, 2002

Related U.S. Application Data (63) Continuation of application No. 08/857,466, filed on May 16, 1997, now Pat. No. 6,317,479.

(30) Foreign Application Priority Data

May 17, 1996 (JP) .............................................. 8-123594
May 28, 1996 (JP) .............................................. 8-133516

(51) Int. Cl.[7] ................................................ G21K 3/00
(52) U.S. Cl. ........................................... 378/34; 378/35
(58) Field of Search ..................................... 378/34, 35

(56) References Cited

U.S. PATENT DOCUMENTS

| 4,516,253 | A | | 5/1985 | Novak ....................... 378/35 X |
|---|---|---|---|---|
| 5,026,239 | A | | 6/1991 | Chiba et al. ............... 378/34 X |
| 5,052,033 | A | * | 9/1991 | Ikeda et al. ..................... 378/34 |
| 5,328,784 | A | * | 7/1994 | Fukuda ......................... 378/34 |
| 5,356,686 | A | | 10/1994 | Fujioka et al. ................. 428/65 |
| 5,422,921 | A | | 6/1995 | Chiba ........................... 378/34 |
| 5,469,489 | A | | 11/1995 | Miyake et al. ................. 378/35 |
| 5,485,495 | A | | 1/1996 | Miyachi et al. ............... 378/34 |
| 5,485,497 | A | * | 1/1996 | Oizumi et al. ................. 378/34 |
| 5,553,110 | A | | 9/1996 | Sentoku et al. ............... 378/35 |
| 5,793,836 | A | | 8/1998 | Maldonado et al. .......... 378/35 |
| 6,101,237 | A | | 8/2000 | Miyachi et al. ............... 378/35 |
| 6,317,479 | B1 | * | 11/2001 | Chiba et al. ................... 378/34 |

FOREIGN PATENT DOCUMENTS

| JP | 63-72119 | 4/1988 |
|---|---|---|
| JP | 2-293716 | 12/1990 |
| JP | 4-240716 | 8/1992 |
| JP | 5-150445 | 6/1993 |
| JP | 5-88534 | 12/1993 |

* cited by examiner

Primary Examiner—David V. Bruce
Assistant Examiner—Hoon Song
(74) Attorney, Agent, or Firm—Fitzpatrick, Cella, Harper & Scinto (57) ABSTRACT

An exposure method for transferring a pattern of a mask onto a member to be exposed. The method includes the steps of making preparations for exposure while a protection cover is attached to the mask, executing alignment between the member to be exposed and the mask while the protection cover is detached from the mask, and executing exposure with X-rays while the protection cover is detached from the mask.

24 Claims, 9 Drawing Sheets

X-RAY MASK, AND EXPOSURE METHOD AND APPARATUS USING THE SAME

This is a continuation application of U.S. patent application No. 08/857,466, filed on May 16, 1997, now U.S. Pat. No. 6,317,479.

BACKGROUND OF THE INVENTION

1. Field of the Invention

The present invention relates to an X-ray mask which is used in the manufacture of microdevices such as semiconductor integrated circuits to transfer a micropattern onto a wafer, and an X-ray exposure method and apparatus using the same.

2. Related Background Art

Semiconductor integrated circuits continue to be minutely downsized in their feature size year by year. Along with this trend, an exposure apparatus for transferring a circuit pattern onto a wafer is required to transfer increasingly minute circuit patterns. For this reason, the wavelength of exposure light used in exposure apparatuses is gradually becoming shorter, and recently, an exposure apparatus using soft X-rays as a transfer means for the most elaborate circuit patterns has been examined.

Upon transferring the circuit pattern of a semiconductor integrated circuit by exposure, contamination due to foreign matter attached to the exposure mask is a very serious problem. If foreign matter becomes attached to a mask, it is transferred onto the wafer and becomes a defect in the circuit pattern. For this reason, attachment of foreign matter must be prevented as much as possible. In particular, in exposure using soft X-rays, since the transmittance of X-rays through various substances is very low, X-rays cannot be transmitted through even very small foreign matter, thus causing defects.

As the circuit pattern is more downsized, it becomes more difficult to remove foreign matter on the mask or to repair the mask. In X-ray masks, such difficulties are pronounced due to their structures.

The X-ray masks are roughly classified into a transmission type mask and a reflection type mask. In a transmission type mask, since a mask pattern (circuit pattern) is formed on a self-supported film, the mask must be repaired to prevent changes in stress of the self-supported film. On the other hand, in a reflection type mask using a multi-layered film reflection mirror, since the reflection layer has a multilayered structure, the mask must be repaired to preclude any influence on the multilayered structure. These techniques, however, are very difficult to achieve. Hence, attachment of foreign matter must be avoided more carefully in the X-ray masks than the masks used in exposure apparatuses using visible light and ultraviolet rays.

In exposure apparatuses using visible light and ultraviolet rays, a pellicle consisting of an organic thin film such as nitrocellulose, parylene, or the like is often set on the mask so as to prevent attachment of foreign matter. Since the pellicle is set therein, foreign matter can be prevented from becoming attached to the mask and, hence, contamination can be avoided.

In particular, in a projection exposure type exposure apparatus, when the pellicle is set to fall outside the field depth of an imaging optical system, even when foreign matter becomes attached onto the pellicle, it is never transferred onto the wafer, and any foreign matter attached onto the pellicle can be easily removed. For this reason, the yield of transferred patterns can be improved greatly. Also, once mask inspection is done upon setting the pellicle, foreign matter inspection on the pellicle need only be performed from then on.

Therefore, in some examples (Japanese Patent Publication No. 5-88534, Japanese Laid-Open Patent Application No. 5-150445), an X-ray transmission thin film such as a diamond film, an organic thin film, or the like, a so-called pellicle, is set on an X-ray mask as well.

SUMMARY OF THE INVENTION

However, since X-ray exposure is normally done in a high vacuum, a reduced pressure atmosphere, or an atmosphere substituted by a gas such as helium with high purity, when a pellicle is set on an X-ray mask, a pressure difference is produced between the dust-proof space inside the pellicle and the surrounding atmosphere, and the pellicle or the mask itself may be destroyed or deformed by the pressure difference.

When the pellicle is set therein, it poses another problem unique to X-rays. That is, the pellicle absorbs X-rays considerably, and the X-ray exposure intensity attenuates.

The present invention has been made to solve the problems of the above-mentioned conventional art, and has as its object to provide an X-ray mask which can attain high-precision exposure while reducing the possibility of mask damage, an exposure method and apparatus using the mask, a device manufacturing method, and the like.

In order to achieve the above object, according to one preferred aspect of the present invention, an X-ray mask is characterized by comprising: a mask pattern; protection means for forming a dust-proof space for protecting the mask pattern; and a hole for ventilating between the dust-proof space and an outer atmosphere.

For example, the X-ray mask comprises a transmission type mask, which comprises an X-ray transparent membrane, on a surface of which the mask pattern is formed, and the protection means is arranged on at least one of a front surface side and a rear surface side of the membrane.

For example, the X-ray mask comprises a reflection type mask, in which a multilayered film reflection layer and the mask pattern are formed on a substrate, and the protection means is arranged on the mask pattern.

For example, the protection member comprises a detachable protection member, or the protection member comprises an X-ray transparent pellicle film.

It is preferable that the protection member be subjected to an antistatic treatment. Also, preferably, the hole has a lid which is free to open/close, or the hole has a filter.

According to another preferred aspect of the present invention, an X-ray mask is characterized by comprising: an X-ray transparent membrane; a mask pattern formed on a surface of the membrane; and protection members formed on both a front surface side and a rear surface side of the membrane and forming a dust-proof space.

According to a preferred aspect of the present invention, an exposure method is characterized by comprising the steps of: preparing an X-ray mask comprising a mask pattern and detachable protection means for forming a dust-proof space for protecting the mask pattern; carrying the X-ray mask with the protection means attached; and exposing the mask pattern to X-rays while the protection means is detached.

The scope of the present invention includes a device manufacturing method for manufacturing a microdevice in processes including the above-mentioned exposure method.

Other objects and aspects of the present invention will become apparent from the following description of the embodiments.

BRIEF DESCRIPTION OF THE DRAWINGS

FIGS. 2A, 2B and 2C are views depicting the states in the use of the X-ray mask and mask pattern protection members shown in FIG. 1, in which

FIGS. 3A and 3B are views showing the arrangement of the second embodiment of an X-ray mask, in which

FIGS. 4A, 4B and 4C are views showing the arrangement of the third embodiment of an X-ray mask, in which

FIGS. 5A and 5B are views showing the arrangement of the fourth embodiment of an X-ray mask, in which

DETAILED DESCRIPTION OF THE PREFERRED EMBODIMENTS

First Embodiment

Figure 1:
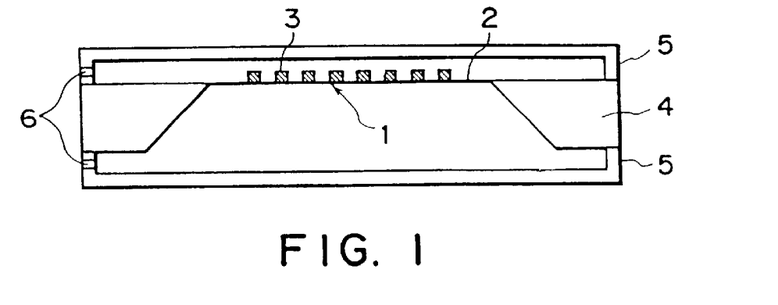
FIG. 1 is a side view showing the arrangement of the first embodiment of an X-ray mask.
Figure 2A:
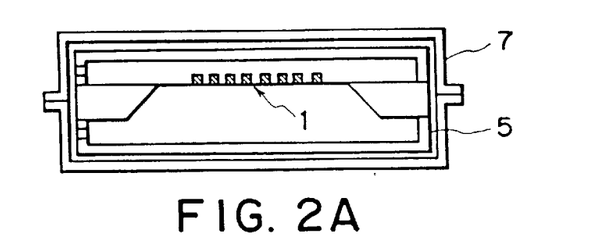
FIG. 2A is a side view in the storage state.
Figure 2B:
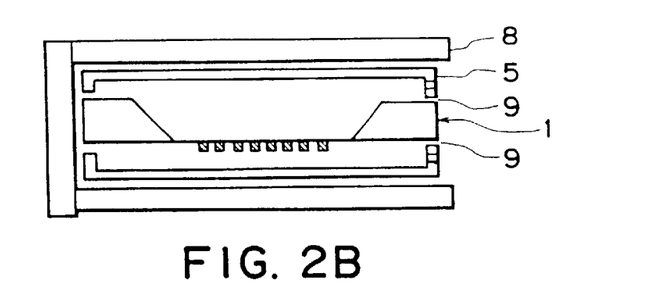
FIG. 2B is a side view of the preparation state upon unloading the X-ray mask.
Figure 2C:
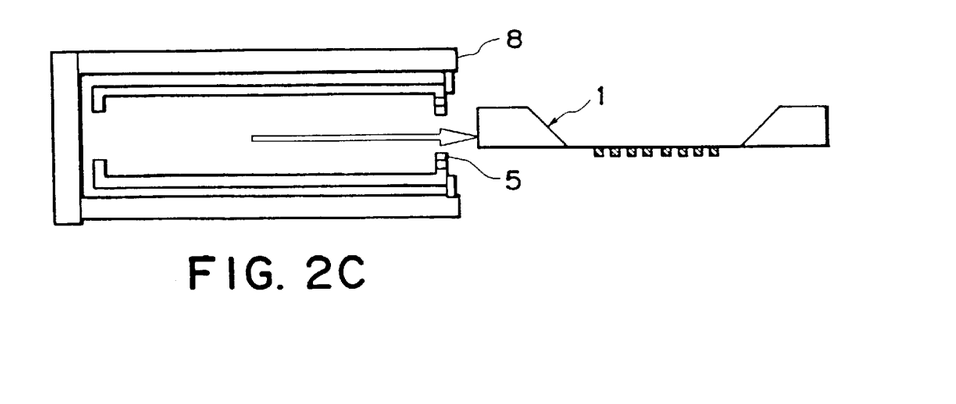
FIG. 2C is a side view when the X-ray mask is unloaded.

FIG. 1 is a side view showing the arrangement of the first embodiment of an X-ray mask according to the present invention. FIGS. 2A to 2C depict the states in the use of the X-ray mask and mask pattern protection members shown in FIG. 1, in which FIG. 2A is a side view in the storage state, FIG. 2B is a side view in the preparation state in which the X-ray mask is unloaded, and FIG. 2C is a side view upon unloading the X-ray mask.

Referring to FIG. 1, an X-ray mask 1 used in this embodiment is a transmission type X-ray mask in which an Au mask pattern 3 serving as an absorber for absorbing X-rays is formed on a 2-μm thick SiC membrane 2 having an Si substrate as a support member 4.

Mask pattern protection members 5 are set on both surfaces of the X-ray mask 1 after defect inspection of the X-ray mask 1 to form a dust-proof space. Each mask pattern protection member 5 is formed of a 1-mm thick plastic plate subjected to an antistatic treatment. Since the mask pattern protection members 5 can transmit visible light, the state of the mask pattern 3 on the X-ray mask 1 can be visually observed while the protection members 5 are attached to the X-ray mask 1.

In the transmission type X-ray mask 1, the membrane 2 that transmits X-rays tends to deform due to the pressure difference between the dust-proof space and atmosphere since it is very thin. In order to prevent this deformation, small holes 6 for adjusting the inner pressure of the dust-proof space are formed on the mask pattern protection members 5.

As shown in FIG. 2A, the X-ray mask 1 is loaded into a mask cassette 7 with the mask pattern protection members 5 attached, and is stored and transported in this state. In this manner, foreign matter can be prevented from becoming attached to the X-ray mask 1 during storage and transportation, and the X-ray mask 1 can be prevented from being damaged upon handling it, especially, upon taking out the X-ray mask 1 from the mask cassette 7 so as to load the X-ray mask 1 into an exposure apparatus.

As an exposure apparatus in which the X-ray mask 1 of this embodiment is used, a proximity gap type equal-magnification exposure apparatus using sychrotron radiation light as a light source is used. The X-ray mask 1, a mask stage on which the X-ray mask 1 is mounted, a wafer, a wafer stage, and devices such as a shutter for controlling X-ray irradiation are set in a reduced-pressure helium atmosphere, and are shielded from an optical system set in a vacuum by an X-ray window. For this reason, the exposure apparatus has a preliminary evacuation chamber for substituting the atmosphere upon loading the X-ray mask 1 into the exposure apparatus.

In the preliminary evacuation chamber, a mask carrier (not shown) for storing a plurality of X-ray masks 1 is arranged, and X-ray masks 1 are stored in mask slots 8 of the mask carrier one by one (FIG. 2B).

Each mask slot 8 has a mechanism (not shown) for forming gaps 9 between the support member of the X-ray mask 1 and the mask pattern protection members 5. When the atmosphere in the preliminary evacuation chamber is substituted by helium, the pressures in the gaps between the X-ray mask 1 and the mask pattern protection members 5 are simultaneously reduced via the forming gaps 9 and the gaps are substituted by helium.

When exposure is performed, a desired X-ray mask 1 is taken out from the corresponding mask slot 8 by the mask carrier, and is carried to a predetermined position in the exposure apparatus. At this time, the mask pattern protection members 5 are detached from the X-ray mask 1 inside the mask slot 8, as shown in FIG. 2C, and the X-ray mask 1 alone is loaded.

The X-ray mask 1 is chucked at a predetermined position in the exposure apparatus by a mask chucking mechanism for holding the mask in position, and is subjected to alignment adjustment with respect to a wafer and exposure.

Upon completion of exposure, the X-ray mask 1 is conveyed to the position of the mask carrier, and is stored in the mask slot 8. At this time, the mask pattern protection members 5 are stored in the mask slot 8.

When the X-ray mask 1 that has already been subjected to exposure is to be unloaded outside the exposure apparatus, the interior of the preliminary evacuation chamber that stores the mask slot 8 is caused to leak to air. At this time, the gas present between the mask pattern protection members 5 and the X-ray mask 1 is simultaneously leaked to air via the gaps 9. Thereafter, the gaps 9 between the X-ray mask 1 and the mask pattern protection member 5 are removed inside the mask slot 8, and the X-ray mask 1 and the mask pattern protection members 5 can be unloaded outside the exposure apparatus while being in tight contact with each other.

Note that various methods of loading the X-ray mask 1 into the exposure apparatus are available. However, the present invention is not limited to a specific method as long as a means, which can change the pressure in the dust-proof space between the X-ray mask 1 and the mask pattern protection members 5 simultaneously with large changes in pressure of the atmosphere therearound so as to keep the same pressure as that of the atmosphere is used.

Also, the mask pattern protection members 5 may be detached from the X-ray mask 1 in the preliminary evacuation chamber, during loading, or at the exposure position.

Second Embodiment

Figures 3A, 3B:
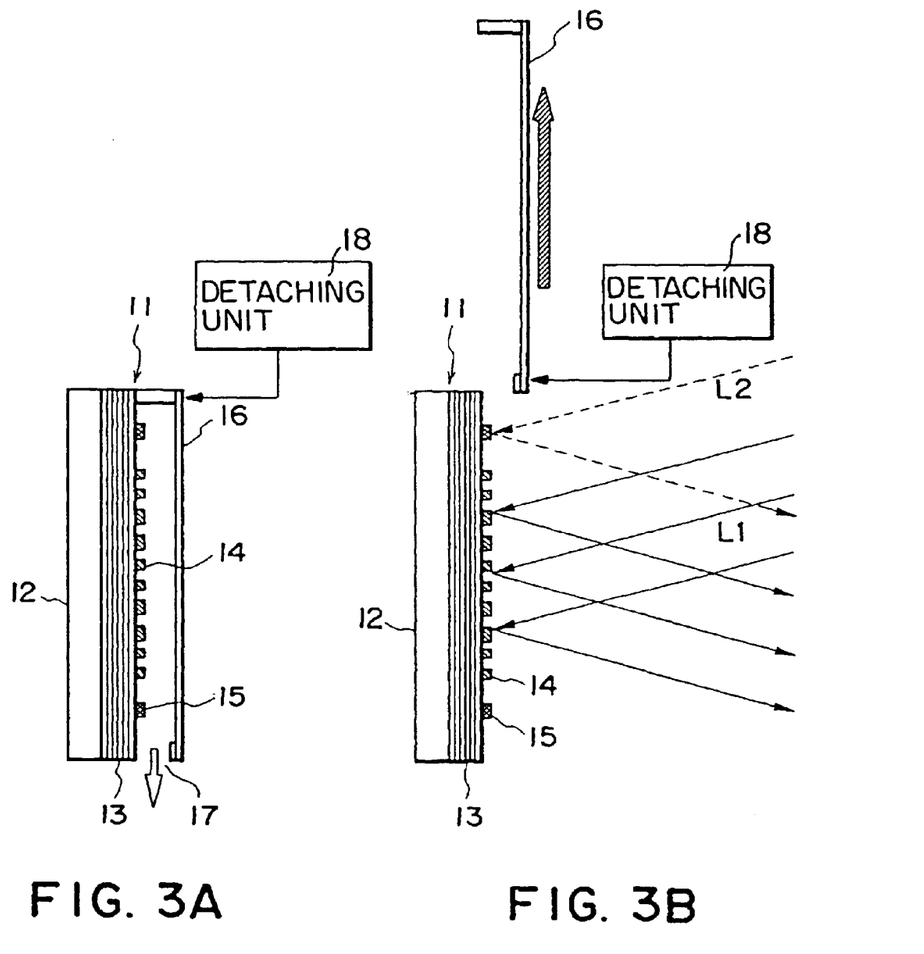
FIG. 3A is a side view of the X-ray mask attached with a mask pattern protection member.
FIG. 3B is a side view showing the state wherein the mask pattern protection member is retreated from the optical paths of exposure light and alignment light.

FIGS. 3A and 3B show the arrangement of the second embodiment of an X-ray mask according to the present invention, in which FIG. 3A is a side view of the mask attached with a mask pattern protection member, and FIG. 3B is a side view showing the state wherein the mask pattern protection member is retreated from the optical paths of exposure light and alignment light.

An X-ray mask 11 used in this embodiment is a reflection type mask, in which a Cr—C multilayered film reflection layer 13 is formed on an SiC substrate 12, and a mask pattern 14 is formed on the layer 13 by patterning an Au layer that absorbs X-rays to have a desired pattern.

Combinations of materials, film thicknesses, and the like of the reflection layer 13 of the reflection type mask are appropriately selected in correspondence with the wavelength used. Typical combinations of the materials include: Mo-Si, W-Si, and the like (in the vicinity of a wavelength of 13 nm); or W-C, Ni-C, and the like (in the vicinity of a wavelength of 5 nm). An alignment mark 15 for alignment adjustment is formed on the peripheral portion of the mask pattern 14.

A mask pattern protection member 16 is formed of a 1-mm thick plastic plate subjected to an antistatic treatment, and has vent holes 17 on the three side surfaces except for the upper surface (FIGS. 3A and 3B depict the lower surface alone). When the mask pattern protection member 16 is set, the mask pattern 14 and the alignment mark 15 are protected.

An exposure apparatus that uses the X-ray mask 11 of this embodiment uses X-rays having a wavelength of 0.7 nm, and the interior of the exposure apparatus is evacuated to a vacuum of about $10^{-4}$ Pa. For this purpose, the exposure apparatus has a preliminary evacuation chamber used for loading the X-ray mask 11 into the exposure apparatus as in the first embodiment.

A series of processes from when the X-ray mask 11 is loaded into the exposure apparatus until it is unloaded outside the exposure apparatus after exposure will be described in turn below.

Note that the mask pattern protection member 16 is attached to the X-ray mask 11 after the mask 11 is subjected to defect inspection, as in the first embodiment, and the X-ray mask 11 is stored in the mask cassette with the mask pattern protection member 16 attached during transportation and storage.

The X-ray mask 11 is taken out from the mask cassette with the mask pattern protection member 16 attached and is stored in each of mask slots (not shown) of a mask carrier inside the preliminary evacuation chamber. At this time, the preliminary evacuation chamber is partitioned from the exposure apparatus to shield air communications, and the interior of the preliminary evacuation chamber is set at the atmospheric pressure.

A desired number of X-ray masks 11 are stored in the mask slots, and the interior of the preliminary evacuation chamber is evacuated. At this time, the dust-proof space inside the mask pattern protection member 16 is also evacuated via the vent holes 17 (FIG. 3A) and is set at the same degree of vacuum as that inside the preliminary evacuation chamber.

When the interior of the preliminary evacuation chamber has reached the predetermined degree of vacuum, the vacuum partition wall between the exposure apparatus and the preliminary evacuation chamber is opened, and the X-ray mask 11 with the mask pattern protection member 16 attached is carried to a predetermined position in the exposure apparatus by a mask carrier.

The mask pattern protection member 16 is kept attached until the X-ray mask 11 is chucked by a mask chuck mechanism for holding the mask in position to prevent foreign matter from becoming attached to the X-ray mask 11 during carrying.

On the other hand, a moving means 18 for retreating the mask pattern protection member 16 from the exposure optical path is arranged in the exposure apparatus, and removes the mask pattern protection member 16 from the exposure optical path after the X-ray mask 11 is chucked. At this time, the mask pattern protection member 16 is withdrawn so as not to disturb the alignment adjustment optical path.

After the mask pattern protection member 16 is retreated, the exposure apparatus performs alignment adjustment using alignment light L2. Upon completion of the alignment adjustment, the exposure apparatus performs exposure using exposure light L1 (FIG. 3B).

Upon completion of the alignment adjustment and exposure, the moving means attaches the mask pattern protection member 16 to the X-ray mask 11 again, and the X-ray mask 11 is returned to the mask carrier in this state to be stored into the mask slot. Note that the mask pattern protection member 16 can also prevent foreign matter from becoming attached to the X-ray mask 11 even during carrying inside the exposure apparatus.

When the X-ray mask 11 is unloaded outside the exposure apparatus after a series of exposure processes have been completed, the vacuum partition wall of the preliminary evacuation chamber is closed again, and the interior of the preliminary evacuation chamber alone is caused to leak to air. At this time, the dust-proof space in the mask pattern protection member 16 is simultaneously leaked via the vent holes 17, thus preventing the X-ray mask 11 and the mask pattern protection member 16 from being damaged by the pressure difference.

Therefore, since the mask pattern protection member 16 is attached to the X-ray mask 11 of this embodiment not only outside the exposure apparatus but also inside the exposure apparatus in which foreign matter becomes attached to the X-ray mask due to the flow of the atmosphere inside the apparatus produced by evacuation or air supply, attachment of foreign matter can be greatly eliminated.

Note that the mask pattern protection member 16 preferably has a closed structure for preventing entrance of foreign matter. However, when the vent holes 17 are formed like in this embodiment, ventilation other than via the vent holes 17 is preferably cut off, and the vent holes 17 also preferably have a structure that can prevent entrance of foreign matter. Accordingly, the vent holes 17 are preferably not open to the entrance routes of foreign matter, i.e., to the surfaces opposing the upper surface in the exposure apparatus and air supply/exhaust ports. Furthermore, more preferably, the ventilation channel is curved not to allow easy entrance of foreign matter onto the mask pattern 14. When the ventilation channel is designed to have a more complex structure, the conductance of the ventilation channel must be taken into consideration so as not to produce any pressure difference between the interior of the mask pattern protection member 16 and the surrounding atmosphere.

It is also effective to arrange a filter, a mesh, or the like on each vent hole 17 to prevent entrance of foreign matter or to arrange a mechanism for adsorbing foreign matter having entered the ventilation channel. Such a structure can also be applied to the pressure adjustment small holes in the mask pattern protection members described in the first embodiment.

Third Embodiment

The third embodiment of the present invention will be described below. In the third embodiment, a reflection type mask similar to that in the second embodiment is used, and vent holes have lids which are free to open/close.

Figure 4A:
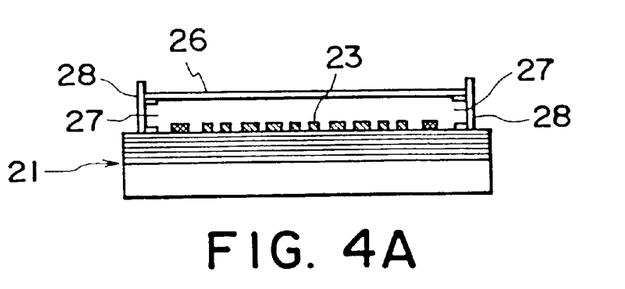
FIG. 4A is a side view in the storage state.
Figure 4B:
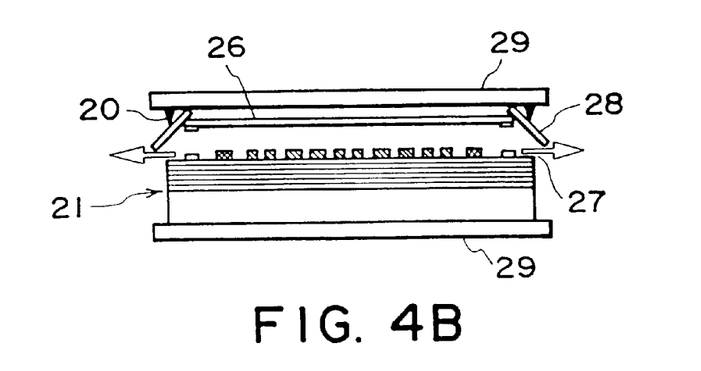
FIG. 4B is a side view showing the state inside a preliminary evacuation chamber.
Figure 4C:
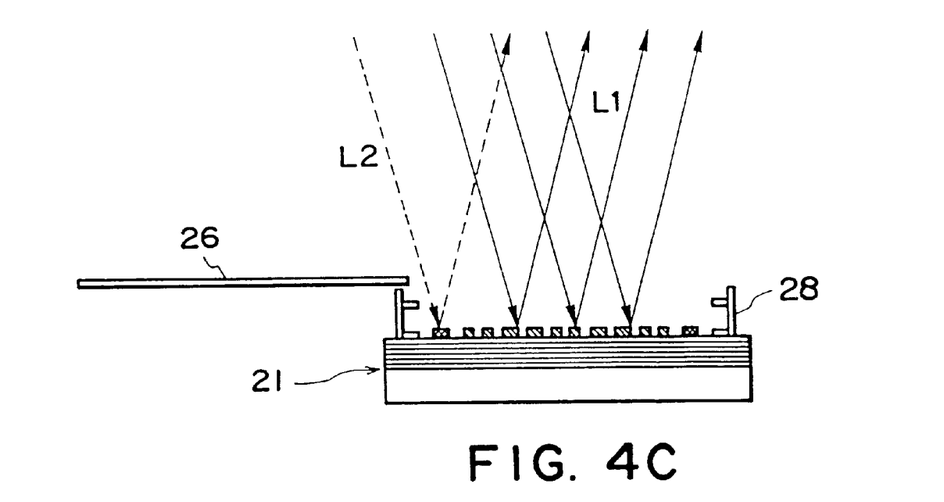
FIG. 4C is a side view showing the state upon alignment adjustment and exposure.

FIGS. 4A to 4C show the arrangement of the third embodiment of an X-ray mask according to the present invention, in which FIG. 4A is a side view showing the storage state, FIG. 4B is a side view showing the state inside a preliminary evacuation chamber, and FIG. 4C is a side view showing the state upon alignment adjustment and exposure.

Referring to FIG. 4A, a mask pattern protection member 26 for protecting a mask pattern 23 is attached onto an X-ray mask 21, and vent holes 27 with lids 28 are formed on the side surfaces of the mask pattern protection member 26. Each lid 28 is biased by a spring to close so as to prevent foreign matter from entering via the vent hole 27 when the mask 21 is present outside the exposure apparatus.

In such a state, the X-ray mask 21 is stored in a mask slot 29 in a preliminary evacuation chamber. Inside the preliminary evacuation chamber, lid open/close pins 20 formed on the mask slot are inserted to press the one-end portions of the lids 28, thereby opening the lid 28 (FIG. 4B). Upon evacuating the interior of the preliminary evacuation chamber, the interior of the mask pattern protection member 26 is also evacuated via the vent holes 27, and is kept at the same pressure as that of the atmosphere inside the preliminary evacuation chamber.

Upon exposure, the X-ray mask 21 with the mask pattern protection member 26 attached is carried from the preliminary evacuation chamber to the predetermined position inside the exposure apparatus by a mask carrier. The mask pattern protection member 26 is kept attached until the X-ray mask 21 is chucked by a mask chuck mechanism for chucking the mask, thus preventing foreign matter from becoming attached to the X-ray mask 21 during its carrying.

Upon executing alignment adjustment and exposure, the mask pattern protection member 26 is retreated from the optical paths of exposure light and alignment light by the same moving means as that in the second embodiment (FIG. 4C).

After the exposure, the mask pattern protection member 26 is returned to the original position on the X-ray mask 21 by the moving means, and the X-ray mask 21 is carried into the preliminary evacuation chamber by the mask carrier.

The interior of the preliminary evacuation chamber is caused to leak and is set at the atmospheric pressure. At the same time, the interior of the mask pattern protection member 26 is also set at the atmospheric pressure via the vent holes 27. Thereafter, the lid open/close pins 20 are removed to close the lids 28, and the X-ray mask 21 is ready to unload from the exposure apparatus.

Note that the lids 28 may be opened only when the atmospheres in the exposure apparatus and preliminary evacuation chamber largely change, or may be kept open in the apparatus and chamber.

An opening/closing mechanism of the lids 28 may be arranged in the preliminary evacuation chamber, or may be added to the carrying mechanism of the mask carrier.

Furthermore, the mask pattern protection member 26 preferably has a closed structure for preventing entrance of foreign matter. However, when the vent holes 27 are formed like in this embodiment, ventilation other than via the vent holes 27 is preferably cut off, and the vent holes 27 also preferably have a structure that can prevent entrance of foreign matter. Accordingly, the vent holes 27 are preferably not open to the entrance routes of foreign matter, i.e., to the surfaces opposing the upper surface in the exposure apparatus and air supply/exhaust ports. Furthermore, more preferably, the ventilation channel is curved not to allow easy entrance of foreign matter onto the mask pattern 23. When the ventilation channel is designed to have a more complex structure, the conductance of the ventilation channel must be taken into consideration so as not to produce any pressure difference between the interior of the mask pattern protection member 26 and the atmosphere therearound.

It is also effective to arrange a filter, a mesh, or the like on each vent hole 27 to prevent entrance of foreign matter or to arrange a mechanism for adsorbing foreign matter having entered the ventilation channel.

Fourth Embodiment

In this embodiment, a transmission type mask similar to that in the first embodiment is used, and a pellicle is attached to the mask.

Figure 5A:
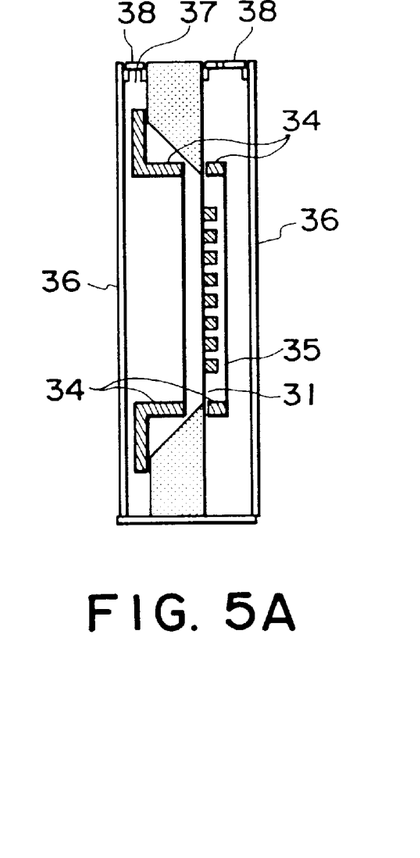
FIG. 5A is a side view in the storage state.
Figure 5B:
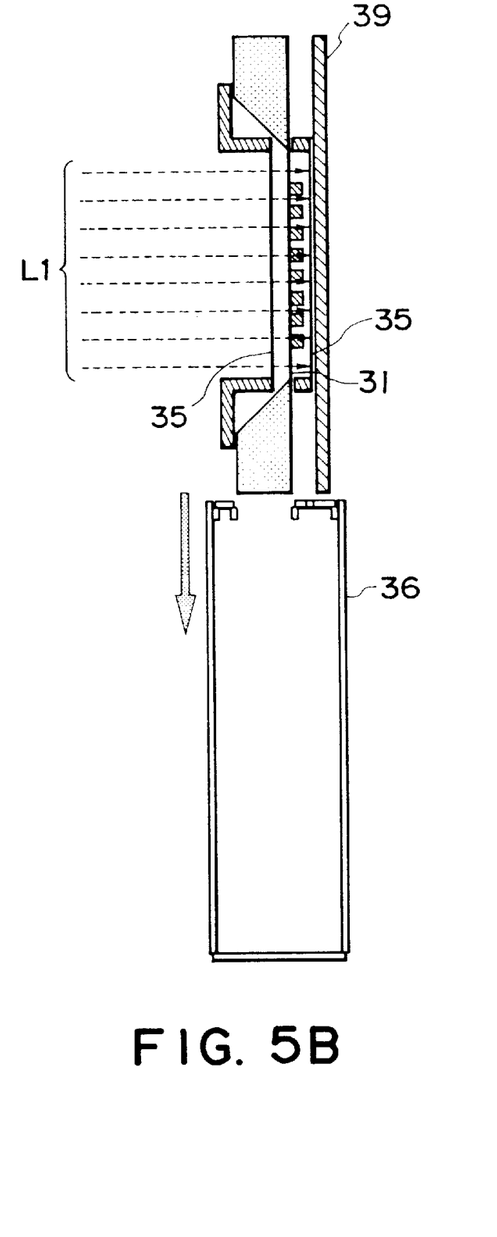
FIG. 5B is a side view showing the state upon alignment adjustment and exposure.

FIGS. 5A and 5B show the arrangement of the fourth embodiment of an X-ray mask according to the present invention, in which FIG. 5A is a side view showing the storage state, and FIG. 5B is a side view showing the state upon alignment adjustment and exposure.

Referring to FIG. 5A, a pellicle 35 is attached onto an X-ray mask 31 via a pellicle support member 34, and a mask pattern protection member 36 is attached thereon. Vent holes 37 with lids 38 are formed on the side surfaces of the mask pattern protection member 36, and, for example, the interior of the member 36 is evacuated by opening the lids 38 when the pressure in the exposure apparatus changes due to evacuation, as in the third embodiment.

In this arrangement, the X-ray mask 31 is stored in a mask slot (not shown) of a mask carrier in a preliminary evacuation chamber while the pellicle 35 and the mask pattern protection member 36 are kept attached thereto.

When exposure is performed, the X-ray mask 31 is carried to the predetermined position in the exposure apparatus by the mask carrier, and the mask pattern protection member 36 is detached from the X-ray mask 31 after the X-ray mask 31 is chucked by a chuck mechanism. After alignment adjustment with respect to a wafer 39 is done, exposure is performed using exposure light L1, as shown in FIG. 5B.

Upon completion of exposure, the mask pattern protection member 36 is attached again to the X-ray mask 31, and they are stored in the mask slot by the mask carrier.

Note that the X-ray mask 31 is stored in a mask cassette (see FIG. 1) when it is carried outside the exposure apparatus. At this time as well, the mask 31 is stored in the mask cassette while the pellicle 35 and the mask pattern protection member 36 are kept attached thereto.

In the proximity gap type exposure apparatus that uses the X-ray mask 31 of this embodiment, since foreign matter attached on the pellicle 35 is also transferred onto the wafer 39, the mask pattern protection member 36 must protect the pellicle 35 and the X-ray mask 31 at the same time.

When the mask pattern protection member 36 is attached onto the pellicle 35 like in this embodiment, foreign matter can be prevented from becoming attached to the X-ray mask 31 and the pellicle 35, thus reducing defects produced in the transferred pattern.

Not only can the X-ray mask 31 and the pellicle 35 be prevented from being damaged, but also the interior of the exposure apparatus can be prevented from being contaminated when the X-ray mask 31 or pellicle 35 is damaged.

Since the mask pattern protection member 36 is attached not only inside but also outside the exposure apparatus, the X-ray mask 31 and the pellicle 35 can be prevented from being damaged.

Note that the mask pattern protection member 36 is preferably kept attached to the X-ray mask 31 except for exposure and alignment adjustment. With the above-mentioned effects, even when the protection member 36 is attached/detached inside the mask carrier, sufficient effects can be assured.

Fifth Embodiment

Figure 6:
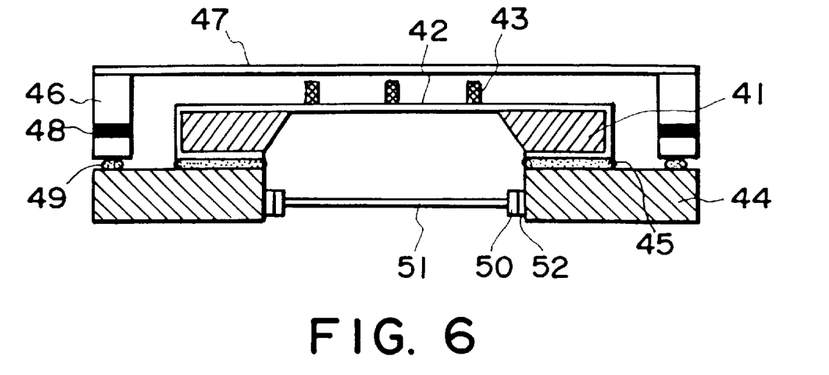
FIG. 6 is a sectional view of an X-ray mask structure of the fifth embodiment.

FIG. 6 is a sectional view of an X-ray mask structure of this embodiment. The X-ray mask structure is made up of a 2-mm thick Si holding frame 41, an X-ray transparent 2.0-$\mu$m thick SiC membrane 42 formed by CVD, an Au X-ray absorber 43 formed by plating, and an SiC reinforcing member 44 adhered to the holding frame 41 by an adhesive 45.

On the reinforcing member 44, a front-side thin film 47 formed on a frame member 46 was mounted by using an easily detachable adhesive 49 to have an interval of 5 $\mu$m from the membrane 42. The frame member 46 was formed of Al to have holes 48 for pressure adjustment. Filters for preventing entrance of dust were attached to these holes 48. The front-side thin film 47 was formed of a polyimide to have a thickness of 0.8 $\mu$m, and its flatness was controlled to 1 $\mu$m or less.

A rear-side thin film 51 formed on a frame member 50 was mounted on the reinforcing member 44 by an easily detachable adhesive (not shown) to have an interval of 5 mm from the membrane 42. The frame member 50 was formed of Al to have holes 52 for pressure adjustment. Filters for preventing entrance of dust were attached to these holes 52. The rear-side thin film 51 was formed of a polyimide to have a thickness of 0.8 $\mu$m as in the front-side thin film 47. The thin films can be attached during an exposure operation.

As described above, since the thin films are mounted on the X-ray mask structure by the easily detachable adhesive to form a dust-proof space, dust can be prevented from directly becoming attached to the mask, and can also be prevented from becoming attached to portions between the adjacent lines of a high-aspect pattern, thus transferring the mask pattern with high precision. Also, the number of times of washing of the mask can be minimized or reduced to zero, and the membrane can be prevented from being damaged or deteriorating due to washing. Even when dust becomes attached to the thin films, dust can be easily inspected by light, and a dust removal process can be easily done by washing or exchanging the thin films. When dust becomes attached to the rear-side thin film, it often has no influence on exposure depending on its material or size, and the dust removal process need not often be performed. Furthermore, since the polyimide has a higher tenacity than SiC, even when the membrane is damaged, the thin films can serve as scattering prevention films that can prevent the membrane from being scattered. As described above, a high-performance X-ray mask structure which can avoid the influence of dust and is suitable for mass production can be provided.

Sixth Embodiment

An X-ray mask structure was fabricated following substantially the same procedure as in the fifth embodiment, except that a front-side thin film 47 and a rear-side thin film 51 consist of polyphenylene sulfite as a conductive polymer and a radiation-resistant polymer. In addition to the effects of the fifth embodiment, since an antistatic effect is provided, the dust attachment prevention effect can be further improved.

Seventh Embodiment

Figure 7:
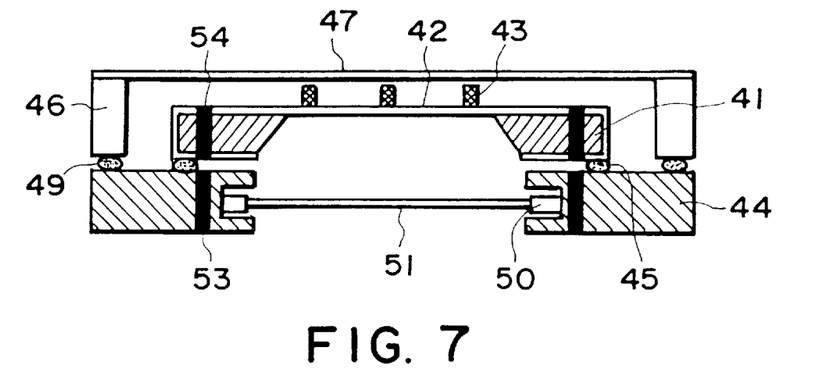
FIG. 7 is a sectional view of an X-ray mask structure of the seventh embodiment.

FIG. 7 is a sectional view of an X-ray mask structure of this embodiment. An X-ray mask structure was fabricated following substantially the same procedure as in the fifth embodiment, except that pressure adjustment holes 53 and 54 were formed not on a frame member 50 but on a reinforcing member 44, a holding frame 41, and a membrane 42 on the mask side, and an adhesive 45 was applied not to close the holes. Since the space between the membrane 42 and a front-side thin film 47 is very narrow, the arrangement of this embodiment is more effective in pressure adjustment.

Eighth Embodiment

Figure 8:
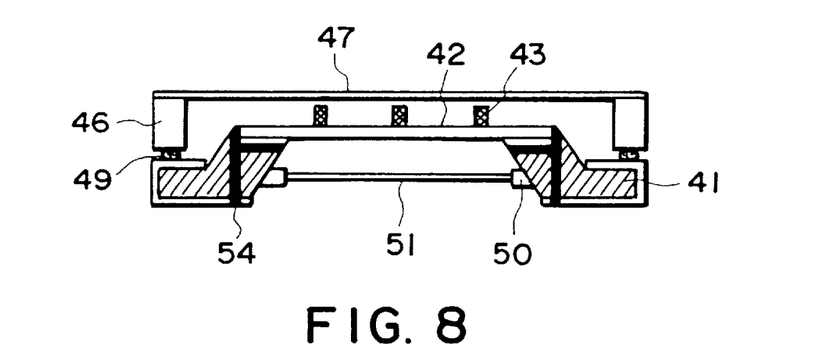
FIG. 8 is a sectional view of an X-ray mask structure of the eighth embodiment.

FIG. 8 is a sectional view of an X-ray mask structure of this embodiment. The X-ray mask structure is made up of a 2-mm thick Si holding frame 41, a 2.0-$\mu$m thick SiN X-ray transparent membrane 42 formed by CVD, and a W X-ray absorber 43.

Steps used for attaching/detaching a thin film were worked on the holding frame 41 with high precision. This work can be attained by anisotropic etching using a strong alkali which is normally used upon forming the holding frame. Thin films on both surfaces were mounted with high precision as in the fifth embodiment. Pressure adjustment holes 54 were formed on the holding frame 41, as shown in FIG. 8. These holes may be formed on a frame member 46.

Even a simple X-ray mask structure having no reinforcing member 44 like in this embodiment could prevent attachment of dust or the like as in the fifth and sixth embodiments.

Ninth Embodiment

Figure 9:
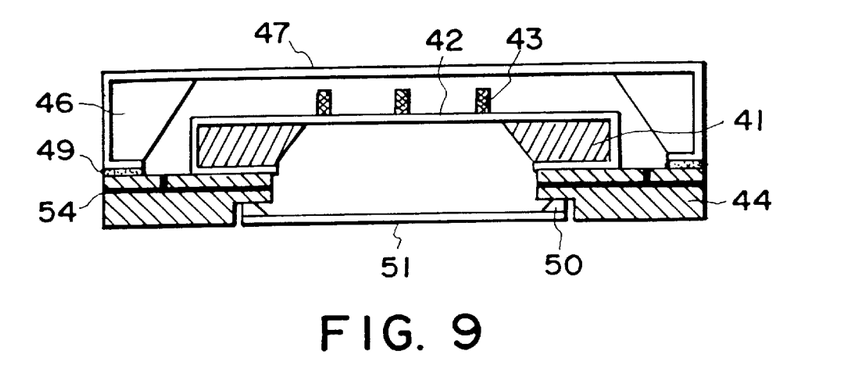
FIG. 9 is a sectional view of an X-ray mask structure of the ninth embodiment.

FIG. 9 is a sectional view of an X-ray mask structure of this embodiment. The X-ray mask structure is made up of a 2-mm thick Si holding frame 41, a 2.0-$\mu$m thick SiN X-ray transparent membrane 42 formed by CVD, a Ta X-ray absorber 43 formed by sputtering, and a pyrex reinforcing member 44 anodically bonded to the holding frame 41.

A 0.4-µm thick DLC (Diamond-like Carbon) front-side thin film 47 formed on an Si frame 46 by CVD was mounted on the reinforcing member 44 by an easily detachable adhesive 49 to have an interval of 10 µm from the membrane 42. The flatness of the thin film 47 was controlled to 1 µm or less. Pressure adjustment holes 54 were formed on the reinforcing member 44 on the mask side, as shown in FIG. 9. These holes may be formed on the frame member 46, as in the fifth embodiment. Filters for preventing entrance of dust were attached to these holes.

Also, a rear-side thin film 51 was formed of 0.4-µm thick DLC on an Si frame member 50, and was mounted on the rear surface of the reinforcing member 44 by an easily detachable adhesive. The interval between the rear-side thin film 51 and the membrane 42 was set at 5 mm.

Since the DLC thin films have higher radiation resistance and conductivity than those of an organic film, dust-proof films which have long-term stability and also serve as antistatic films can be provided.

10th Embodiment

Figure 10:
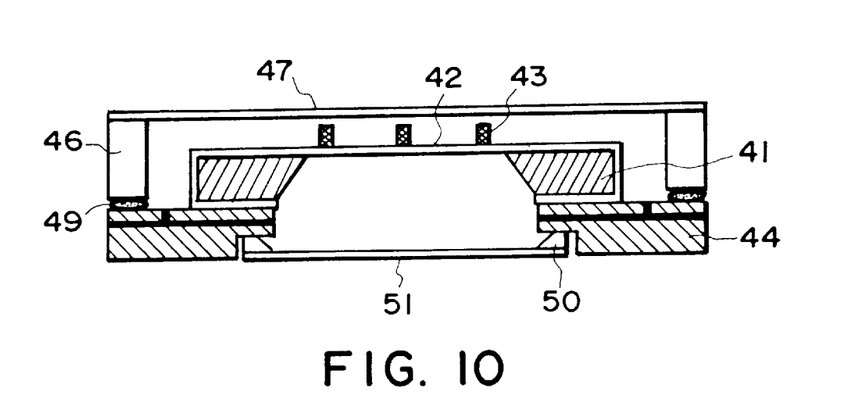
FIG. 10 is a sectional view of an X-ray mask structure of the tenth embodiment.

FIG. 10 is a sectional view of an X-ray mask structure of this embodiment. An X-ray mask structure was fabricated following substantially the same procedure as in the ninth embodiment, except that a front-side thin film 47 used polyphenylene sulfite (thickness=0.8 µm) having high radiation resistance and conductivity, and the shape of a frame member was changed.

11th Embodiment

Figure 11:
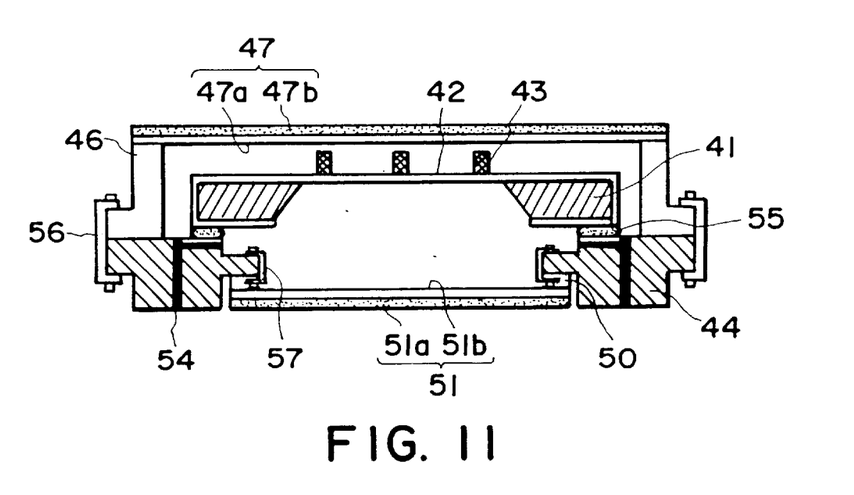
FIG. 11 is a sectional view of an X-ray mask structure of the eleventh embodiment.

FIG. 11 is a sectional view of an X-ray mask structure of this embodiment. The X-ray mask structure is made up of a 2-mm thick Si holding frame 41, a 2.0-µm thick SiN X-ray transparent membrane 42 formed by CVD, a W X-ray absorber 43 formed by sputtering, and an SiC reinforcing member 44 directly bonded to the holding frame 41 by metal diffusion (metal diffused portions 55 of, e.g., Au, Cu, Si, or the like).

A front-side thin film 47, which consisted of two layers, i.e., a 0.5-µm thick polyimide film 47a and a 0.3-µm thick ITO film 47b, and was formed on an SiC frame member 46, was mounted on the reinforcing member 44 by screws 56 that could be easily attached/detached, so as to have an interval of 8 µm from the membrane 42. The flatness of the front-side thin film 47 was controlled to 1 µm or less. Pressure adjustment holes 54 were formed on the reinforcing member 44, as shown in FIG. 11. These holes may be formed on the frame member 46. Filters for preventing entrance of dust were attached to these holes.

A rear-side thin film 51 was also formed by a two-layered film (a polyimide film 51a and an ITO film 51b) as in the front-side thin film 47, and was mounted on the reinforcing member 44 by screws 57.

Since each thin film has a two-layered structure in which the polyimide film having high tenacity but serving as an insulator is formed on the membrane side (47a, 51a), and the ITO film serving as a conductor is formed on the side (47b, 51b) opposite to the membrane side, it can serve as a dust-proof film, and can improve its functions of an anti-static film and a scattering prevention film. The ITO film as a conductor can serve as an antistatic film that can prevent attachment of dust, and the polyimide film having high tenacity and serving as an insulator can prevent scattering of the membrane if the membrane is damaged, so that the scattered pieces can be positively collected by static electricity.

12th Embodiment

An X-ray exposure apparatus used in the manufacture of microdevices (semiconductor devices, thin film magnetic heads, micromachines, and the like) using a mask structure will be described below with reference to FIG. 12.

Figure 12:
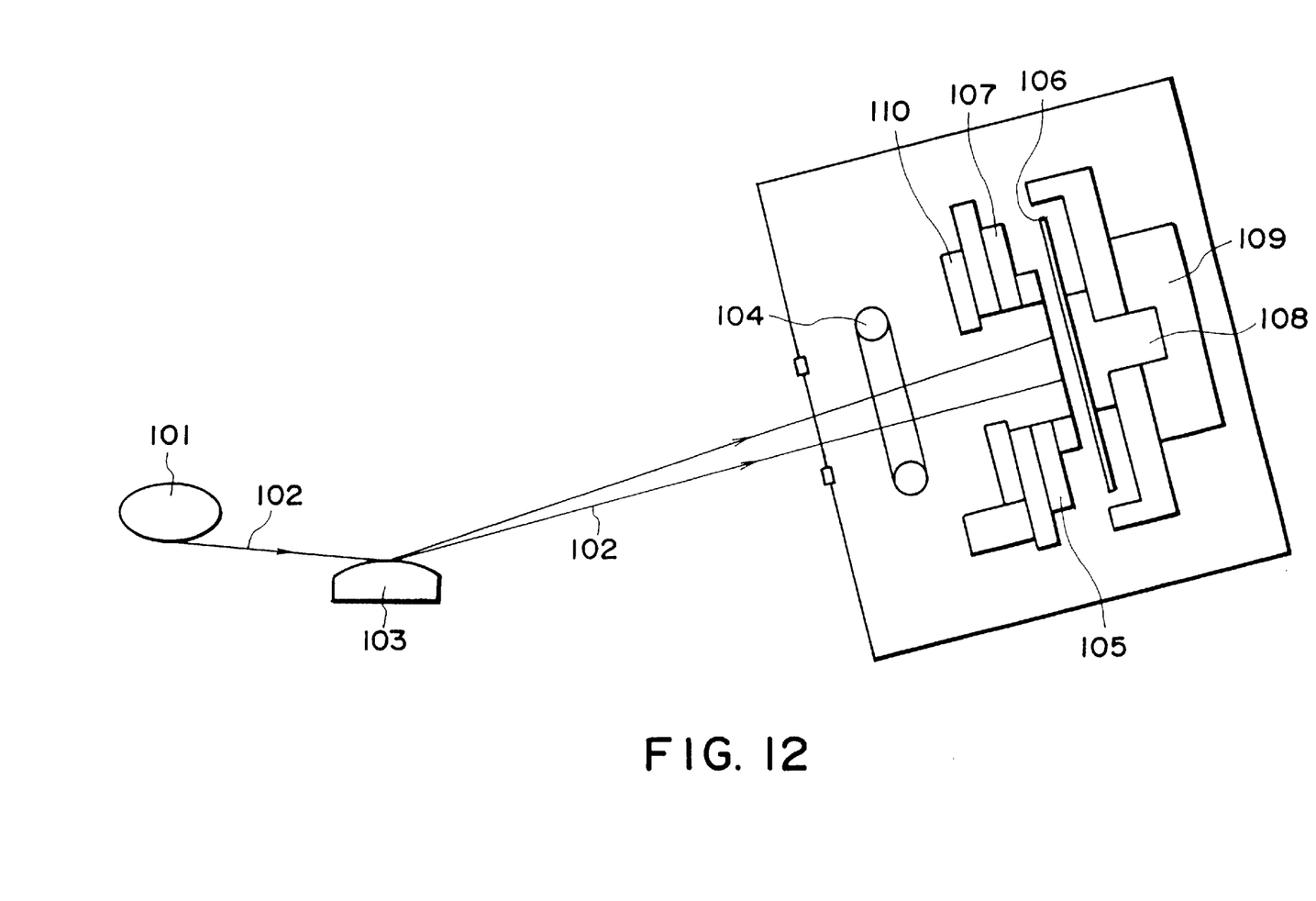
FIG. 12 is an explanatory view of an X-ray exposure apparatus comprising the X-ray mask structure.

FIG. 12 is a schematic view showing a principal part of an X-ray exposure apparatus comprising an X-ray mask structure of the present invention. Referring to FIG. 12, synchrotron radiation light 102 radiated by an SR radiation source 101 has a sheet beam shape whose light intensity spreads uniformly in the horizontal direction but spreads little in the vertical direction. The synchrotron radiation light is expanded in the vertical direction when it is reflected by a cylindrical mirror (convex mirror 103), so as to be converted into a beam having a nearly rectangular section, thus obtaining a rectangular exposure region. The expanded radiation light 102 is adjusted by a shutter 104 to have a uniform exposure amount in the irradiated region. The radiation light 102 that has passed through the shutter is guided to an X-ray mask structure 105.

The X-ray mask structure is chucked on a mask stage 107, and is held at a position opposing a wafer 106 as the object to be exposed. The wafer is held by a wafer chuck 108. The wafer chuck is mounted on a wafer stage 109. By moving the wafer stage, the position of the wafer is determined.

An alignment unit 110 has an optical system for detecting alignment marks formed on the X-ray mask structure 105 and the wafer 106, and an arithmetic unit for calculating the displacement between the two marks.

When the X-ray mask structure 105 of the present invention is used, transmittances of 80% or higher (or less than the maximum value—5%) can be obtained at a plurality of wavelengths used in alignment (positioning), thus improving the S/N ratio of alignment light and allowing high-precision alignment.

After the alignment, when a pattern formed on the X-ray mask structure is transferred onto the wafer 106 by step & repeat or scanning exposure, X-ray exposure can be precisely attained, and mass production can also be realized.

13th Embodiment

The method of manufacturing a microdevice using the X-ray mask and the exposure apparatus will be explained below. The microdevice includes semiconductor chips such as ICs, LSIs, liquid crystal devices, micromachines, thin film magnetic heads, and the like. A method of manufacturing a semiconductor device will be exemplified below.

Figure 13:
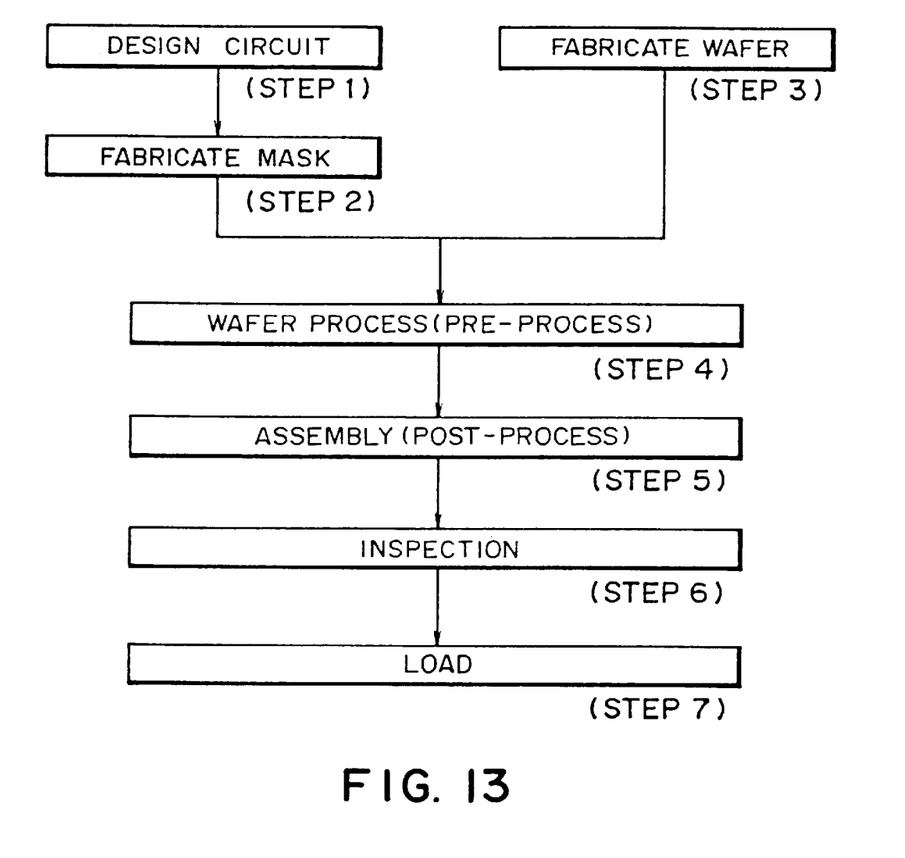
FIG. 13 is a flow chart showing the manufacturing process of a semiconductor device.

FIG. 13 shows the overall flow in the manufacture of a semiconductor device. In step 1 (circuit design), the circuit design of a semiconductor device is made. In step 2 (fabricate mask), a mask formed with the designed circuit pattern is fabricated. On the other hand, in step 3 (fabricate wafer), a wafer is fabricated using a material such as silicon. Step 4 (wafer process) is also called a pre-process, and an actual circuit is formed on the wafer by photolithography using the prepared X-ray mask and wafer. The next step 5 (assembly) is also called a post-process, in which semiconductor chips are assembled using the wafer obtained in step 4, and includes an assembly process (dicing, bonding), a packaging process (encapsulating chips), and the like. In step 6 (inspection), inspections such as operation confirmation tests, durability tests, and the like of semiconductor devices assembled in step 5 are conducted. Semiconductor devices are completed via these processes, and are loaded (step 7).

Figure 14:
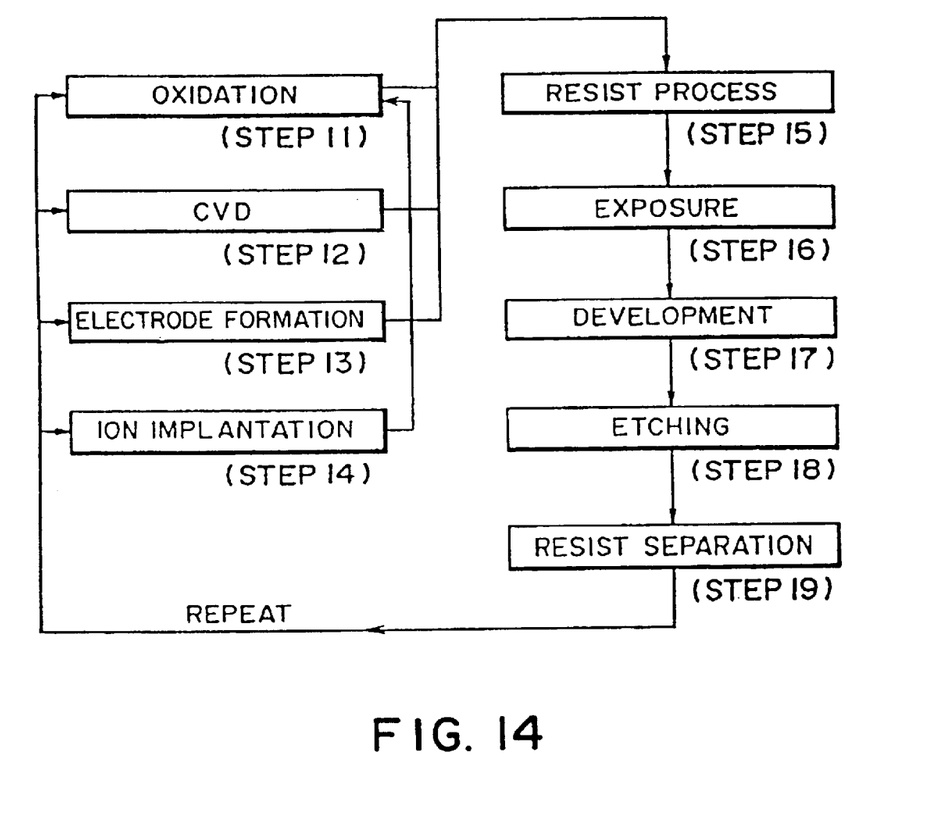
FIG. 14 is a flow chart showing the wafer process in the manufacturing method of a semiconductor device.

FIG. 14 shows the detailed flow of the wafer process. In step 11 (oxidation), the surface of the wafer is oxidized. In step 12 (CVD), an insulating film is formed on the wafer surface. In step 13 (electrode formation), electrodes are formed by deposition on the wafer. In step 14 (ion implantation), ions are implanted into the wafer. In step 15 (resist process), a photosensitive agent is applied on the wafer. In step 16 (exposure), the circuit pattern on the mask is printed on the wafer by exposure using the above-mentioned exposure apparatus. In step 17 (development), the exposed wafer is developed. This step includes a PEB (Post Exposure Bake) process inherent to a chemical sensitization type resist. In step 18 (etching), a portion other than the developed resist image is removed by etching. In step 19 (remove resist), the resist film which becomes unnecessary after etching is removed. By repetitively executing these steps, multiple circuit patterns are formed on the wafer. According to the manufacturing method of this embodiment, a highly integrated semiconductor device which is not easy to manufacture by the conventional method can be manufactured.

What is claimed is:

1. An exposure method for transferring a pattern of a mask onto a member to be exposed, said method comprising the steps of:
    preparing for exposure while a protection cover is attached to the mask;
    executing alignment between the member to be exposed and the mask while the protection cover is detached from the mask; and
    executing exposure with X-rays while the protection cover is detached from the mask.

2. A method according to claim 1, wherein the protection cover is detached at a position for the exposure.

3. A method according to claim 1, wherein the mask has a multilayered film reflection type mirror and the pattern is formed on the multilayered film reflection type mirror, and wherein the pattern absorbs the X-rays.

4. A device manufacturing method comprising the steps of:
    preparing for exposure while a protection cover is attached to the mask;
    executing alignment between the member to be exposed and the mask while the protection cover is detached from the mask; and
    transferring a pattern of the mask onto the member to be exposed with X-rays while the protection cover is detached from the mask, to manufacture a device using the member.

5. A method according to claim 4, wherein the protection cover is detached from the mask at a position for exposure.

6. A method according to claim 4, wherein the mask has a multilayered film reflection type mirror and the pattern is formed on the multilayered film reflection type mirror, and wherein the pattern absorbs the X-rays.

7. An exposure method for transferring a pattern of a mask onto a member to be exposed, said method comprising the steps of:
    attaching a protection cover to the mask at an attaching position;
    detaching the protection cover from the mask at a position different from the attaching position;
    executing alignment between the member to be exposed and the mask from which the protection cover has been detached; and
    executing exposure with X-rays, by using the mask from which the protection cover has been detached.

8. A method according to claim 7, wherein the protection cover is detached from the mask at a position for exposure.

9. A method according to claim 7, wherein the mask has a multilayered film reflection type mirror and the pattern is formed on the multilayered film reflection type mirror, and wherein the pattern absorbs the X-rays.

10. A device manufacturing method comprising the steps of:
    attaching a protection cover to a mask at an attaching position;
    detaching the protection cover from the mask at a position different from the attaching position;
    executing alignment between a member to be exposed and the mask from which the protection cover has been detached; and
    transferring a pattern onto the member to be exposed by exposure with X-rays by using the mask from which the protection cover has been detached, to manufacture a device using the member.

11. A method according to claim 10, wherein the protection cover is detached from the mask at a position for exposure.

12. A method according to claim 10, wherein the mask has a multilayered film reflection type mirror and the pattern is formed on the multilayered film reflection type mirror, and wherein the pattern absorbs the X-rays.

13. An exposure method for transferring a pattern of a mask onto a member to be exposed, said method comprising the steps of:
    providing the mask, which includes (i) a multilayered film reflection type mirror, (ii) a pattern, formed on the multilayered film reflection type mirror, which absorbs X-rays, and (iii) a protection cover covering at least a portion of the multilayered film reflection type mirror, and structured to be detachable from the multilayered film reflection type mirror;
    executing alignment between the member to be exposed and the mask while the protection cover is detached from the mask; and
    executing exposure with X-rays while the protection cover is detached from the mask.

14. An exposure apparatus comprising:
    means for holding a mask that includes (i) a multilayered film reflection type mirror, (ii) a pattern, formed on the multilayered film reflection type mirror, which absorbs X-rays, and (iii) a protection cover covering at least a portion of the multilayered film reflection type mirror, and structured to be detachable from the multilayered film reflection type mirror;
    means for holding a member to be exposed; and
    means for detaching the protection cover from the mask, wherein alignment between the mask and the member is executed while the protection cover is detached from the mask, and exposure with X-rays is executed while the protection cover is detached from the mask.

15. A device manufacturing method comprising the steps of:
    providing a mask which comprises (i) a multilayered film reflection type mirror, (ii) a pattern, formed on the multilayered film reflection type mirror, which absorbs X-rays, and (iii) a protection cover covering at least a portion of the multilayered film reflection type mirror, and structured to be detachable from the multilayered film reflection type mirror;
    executing alignment between a member to be exposed and the mask while the protection cover is detached from the mask; and transferring the pattern onto the member to be exposed with X-rays while the protection cover is detached from the mask, to manufacture a device using the member.

16. An exposure method for transferring a pattern of a mask onto a member to be exposed, said method comprising the steps of:

preparing for exposure while the mask is attached with a protection member;

executing alignment between the member to be exposed and the mask while the protection member is detached from the mask; and executing exposure with X-rays while the mask is detached from the protection member.

17. A method according to claim 16, wherein the mask has a multilayered film reflection type mirror and the pattern is formed on the multilayered film reflection type mirror, and wherein the pattern absorbs the X-rays.

18. A device manufacturing method comprising the steps of:

preparing for exposure while a mask is attached with a protection member;

executing alignment between a member to be exposed and the mask while the protection member is detached from the mask; and transferring a pattern of the mask onto the member to be exposed while the mask is detached from the protection member, so as to manufacture a device using the member.

19. A method according to claim 16, wherein the mask has a multilayered film reflection type mirror and the pattern is formed on the multilayered film reflection type mirror, and wherein the pattern absorbs the X-rays.

20. An exposure apparatus comprising:

means for holding a mask;

means for holding a member to be exposed; and means for detaching a protection cover from the mask, wherein alignment between the mask and the member is executed while the protection cover is detached from the mask, and exposure with X-rays is executed while the protection cover is detached from the mask.

21. An exposure apparatus comprising:

means for holding a mask;

means for holding a member to be exposed; and means for detaching the mask from a protection member, wherein alignment between the mask and the member to be exposed is executed while the mask is detached from the protection member, and exposure with X-rays is executed while the mask is detached from the protection member.

22. A method for exposing a member to be exposed with a pattern on a mask, said method comprising steps of:

performing preparation for and exposure operation by covering the pattern with a protection member; and performing an alignment of the member to be exposed and the mask without covering the pattern with the protection member and performing the exposure operation by using X-rays.

23. A device manufacturing method comprising steps of:

performing preparation for an exposure operation by covering the pattern with a protection member;

performing an alignment of the member to be exposed and the mask without covering the pattern with the protection member and performing the exposure operation by using X-rays; and developing the member to be exposed.

24. An exposure apparatus for exposing a member to be exposed with a pattern on a mask, said apparatus comprising:

a mirror for guiding X-rays to the mask;

a first state for holding the mask;

a second state for holding the member to be exposed; and means for separating the mask and a protection member which covers the pattern on the mask, wherein an alignment of the member to be exposed and the mask is performed without covering the pattern with the protection member and the member to be exposed is exposed by the X-rays.

* * * * *

UNITED STATES PATENT AND TRADEMARK OFFICE
CERTIFICATE OF CORRECTION

PATENT NO. : 6,728,332 B2
DATED : April 27, 2004
INVENTOR(S) : Kieko Chiba et al.

It is certified that error appears in the above-identified patent and that said Letters Patent is hereby corrected as shown below:

Column 11,
Line 56, "having" should read -- having a --.

Column 15,
Line 30, "claim 16," should read -- claim 18, --.

Column 16,
Lines 32 and 33, "state" should read -- stage --.

Signed and Sealed this

First Day of February, 2005

JON W. DUDAS
*Director of the United States Patent and Trademark Office*

UNITED STATES PATENT AND TRADEMARK OFFICE
CERTIFICATE OF CORRECTION

PATENT NO. : 6,728,332 B2
DATED : April 27, 2004
INVENTOR(S) : Chiba et al.

It is certified that error appears in the above-identified patent and that said Letters Patent is hereby corrected as shown below:

<u>Title page,</u>
Item [*] Notice, delete the phrase "by 82 days" and insert -- by 0 days --

Signed and Sealed this

Twenty-second Day of March, 2005

JON W. DUDAS
*Director of the United States Patent and Trademark Office*